United States Patent
Lee et al.

(10) Patent No.: US 7,120,080 B2
(45) Date of Patent: Oct. 10, 2006

(54) DUAL PORT SEMICONDUCTOR MEMORY DEVICE

(75) Inventors: Tae-Jung Lee, Hwaseong-gun (KR); Byung-Sun Kim, Suwon (KR); Joon-Hyung Lee, Seongnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 202 days.

(21) Appl. No.: 10/751,178

(22) Filed: Jan. 2, 2004

(65) Prior Publication Data
US 2004/0151041 A1    Aug. 5, 2004

(30) Foreign Application Priority Data
Jan. 30, 2003   (KR) .............. 10-2003-0006365

(51) Int. Cl.
| | |
|---|---|
| G11C 8/00 | (2006.01) |
| G11C 5/06 | (2006.01) |
| G11C 11/00 | (2006.01) |
| G06F 12/00 | (2006.01) |
| G06F 13/28 | (2006.01) |

(52) U.S. Cl. .............. 365/230.05; 365/63; 365/154; 257/371; 711/131; 711/149

(58) Field of Classification Search .......... 365/154, 365/72, 230.05
See application file for complete search history.

(56) References Cited

U.S. PATENT DOCUMENTS

| | | | |
|---|---|---|---|
| 4,933,899 A * | 6/1990 | Gibbs .................. | 365/177 |
| 5,544,122 A * | 8/1996 | Mizukami et al. ..... | 365/230.05 |
| 5,754,468 A | 5/1998 | Hobson | |
| 5,877,976 A | 3/1999 | Lattimore et al. | |
| 6,005,795 A | 12/1999 | Hawkins et al. | |
| 6,862,245 B1 * | 3/2005 | Kim et al. ............. | 365/230.05 |
| 2002/0174298 A1 | 11/2002 | Hsu et al. | |
| 2003/0076282 A1 * | 4/2003 | Ikeda et al. ........... | 345/55 |

FOREIGN PATENT DOCUMENTS

| | | |
|---|---|---|
| EP | 0530988 A2 | 3/1993 |
| JP | 10-178110 | 6/1998 |
| KR | 2001-0106233 | 11/2001 |

OTHER PUBLICATIONS

English language abstract of Japanese Publication No. 10-178110.
English language abstract of Korean Publication No. 2001-0106233.

* cited by examiner

*Primary Examiner*—Amir Zarabian
*Assistant Examiner*—Ly Duy Pham
(74) *Attorney, Agent, or Firm*—Marger Johnson & McCollom, P.C.

(57) ABSTRACT

A dual port semiconductor memory device, including PMOS scan transistors, is provided. The dual port semiconductor memory device includes two PMOS transistors, two NMOS pull-down transistors, two NMOS pass transistors, and a PMOS scan transistor. The scan transistor being PMOS, noise margins can be improved. In addition, these seven transistors are arranged in two n-wells and 2 p-wells, while n-wells and p-wells are arranged in series and in alternating fashion. Therefore, the length of a memory cell along the minor axis of the memory cell is relatively short. This memory cell layout helps shorten the length of a bit line by arranging a pair of bitlines in parallel with well boundaries, i.e., in the direction of the short axis of the memory cell, and makes it possible to prevent crosstalk between a bitline and a complementary bitline by arranging conductive lines between the bitline and the complementary bitline.

21 Claims, 8 Drawing Sheets

DUAL PORT SEMICONDUCTOR MEMORY DEVICE

BACKGROUND OF THE INVENTION

This application claims priority from Korean Patent Application No. 2003-6365, filed on Jan. 30, 2003, in the Korean Intellectual Property Office, the disclosure of which is incorporated herein in its entirety by reference.

1. Field of the Invention

The present invention relates to a semiconductor memory device and, more particularly, to a dual port static random access memory (SRAM) device having a memory cell comprised of a plurality of transistors.

2. Description of the Related Art

Semiconductor memory devices are classified into dynamic random access memories (DRAMs) and static random access memories (SRAMs). SRAMs advantages include high operation speed, low power consumption, and simple operation. In addition, there is no need to refresh data stored in SRAMs. Since SRAMs are compatible with a logic semiconductor device manufacturing process, they are generally used as embedded memories.

A typical SRAM cell includes two driver transistors (or pull-down transistors), two load devices, and two pass transistors (or access transistors). According to the type of a load device an SRAM includes, SRAM is classified into CMOS, high load resistor (HLR), or thin film transistor (TFT) types. A CMOS-type SRAM adopts a P channel-type MOS (PMOS) transistor as a load device, an HLR-type SRAM adopts a high resistor as a load device, and a TFT-type SRAM adopts a polysilicon TFT as a load device.

Therefore, a CMOS-type SRAM memory cell typically consists of 6 transistors, including two PMOS transistors used as load devices. Of the 6 transistors, four are generally N channel-type MOS (NMOS) transistors. Of the four NMOS transistors, two form inverters with the two PMOS transistors, and two are pass transistors.

Figure 1:
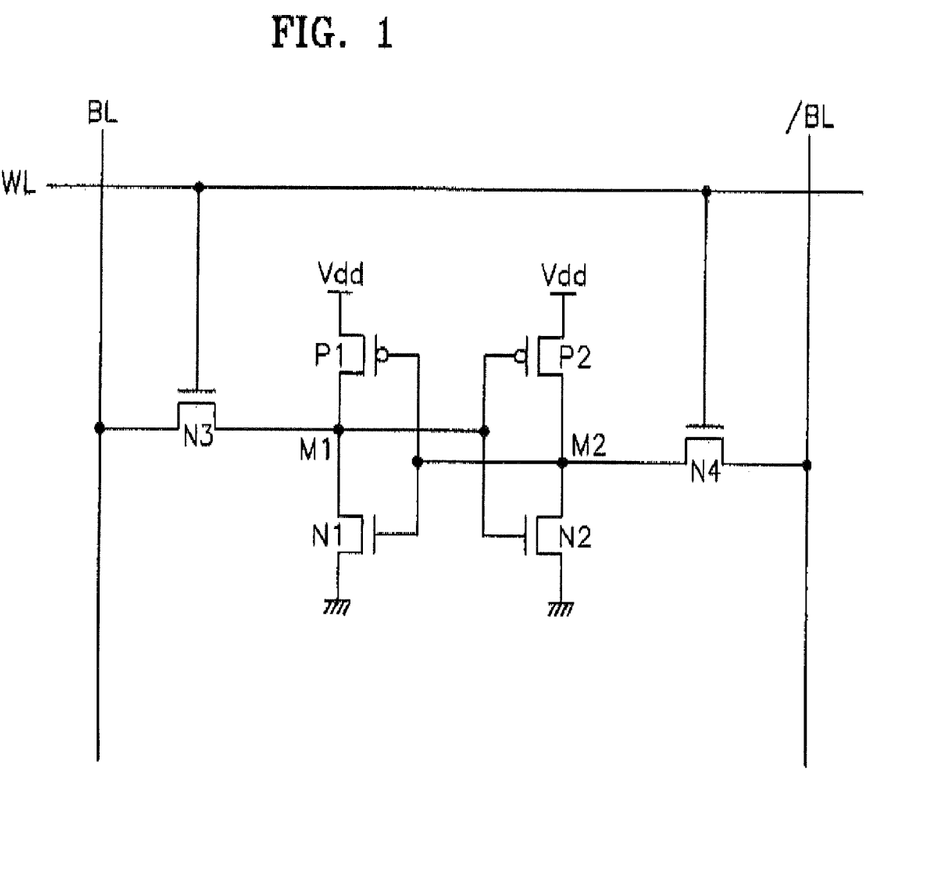
FIG. 1 is a circuit diagram of a single port semiconductor memory device.

FIG. 1 is a circuit diagram of an equivalent circuit of a single port SRAM device including 6 transistors. The memory cell layout of the single port SRAM device is disclosed in Japanese Patent Publication No. 10-178110.

Referring to FIG. 1, a first PMOS transistor P1 and a first NMOS transistor N1 constitute a first CMOS inverter, a second PMOS transistor P2 and a second NMOS transistor N2 constitute a second CMOS inverter. An input port of the first CMOS inverter and an output port of the second CMOS inverter are connected at memory node M1, and an output port of the first CMOS inverter and an input port of the second CMOS inverter are connected at a second memory node M2. This structure enables the first and second CMOS inverters to constitute a flip-flop circuit.

NMOS transistors N3 and N4 are pass transistors and also serve as access transistors. The gate of each of the pass transistors N3 and N4 is connected to a wordline (WL). The source and drain of the transistor N3 are connected to the first memory node M1 and a bitline BL, respectively, and the source and drain of the transistor N4 are connected to the second memory node M2 and a complementary bitline /BL, respectively.

At the memory cell level, numerous factors affect operation speed in a CMOS SRAM device, i.e., the resistance characteristics of interconnections and the amount of parasitic capacitance occurring between a bitline and a complementary bitline adjacent to the bitline.

The number of data read or write ports, also affects operation speed of SRAM devices. For example, in single port SRAM device, a pair of bitlines, connected to each other through a pass transistor, serves as an input port and an output port. When the single port SRAM device inputs or outputs data using the pair of bitlines, other data cannot be input or output via the pair of bitlines, data is not processed in parallel. For these reasons, operation speed of single port SRAM devices is limited.

A variety of multi-port CMOS SRAM devices, including a plurality of input and/or output ports, have been suggested. U.S. Pat. Nos. 5,754,468 and 6,005,795 disclose the memory cell layout of an equivalent circuit of a multi-port SRAM device.

A multi-port SRAM device can simultaneously carry out various operations, such as inputting, outputting, writing, and reading data, using different ports provided to serve different operations. In addition, the multi-port SRAM device can output data stored in a single memory cell to another system via each port. Therefore, the multi-port SRAM device is convenient for high-speed operations and data parallel processing systems.

SUMMARY OF THE INVENTION

It is therefore an object of the present invention to address disadvantages associated with prior semiconductor memory devices. It is another an object of the present invention to provide a dual port semiconductor memory device capable of enhancing noise margins of memory cells, minimizing parasitic capacitance caused by pairs of bitlines, and preventing crosstalk between adjacent pairs of bitlines.

It is yet another object of the invention to provide a dual port semiconductor memory device having a major axis much longer than a minor axis, such as a liquid crystal display (LCD) driver integrated circuit (IC).

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 2:
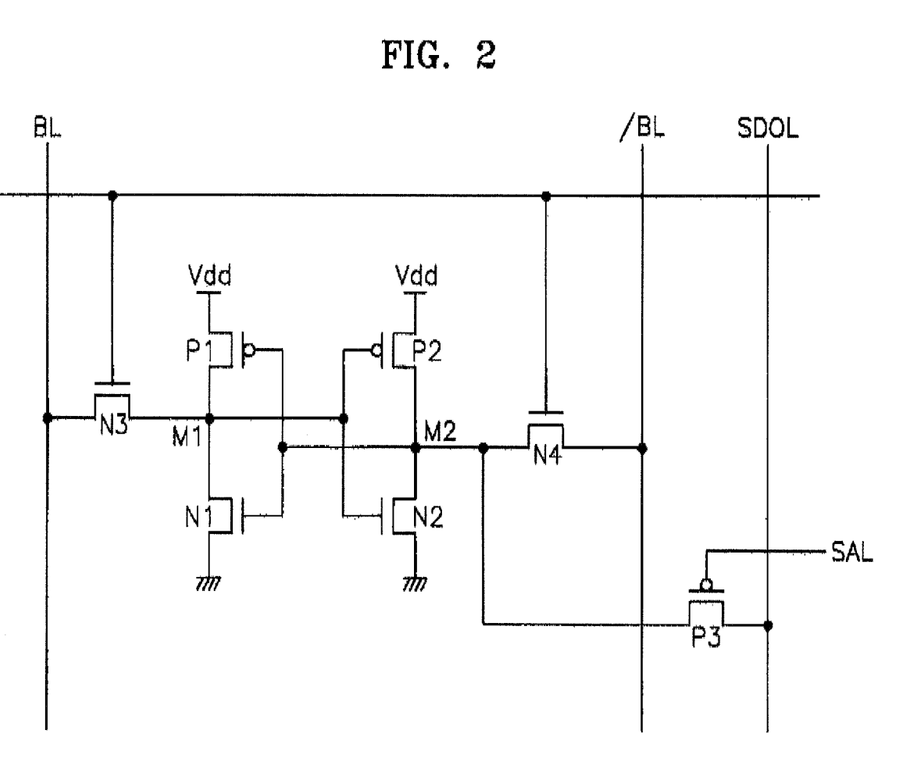
FIG. 2 is a circuit diagram of a dual port semiconductor memory device according to a preferred embodiment of the present invention.

Referring to FIG. 2, a circuit diagram of a dual port semiconductor memory device according to one embodiment of the invention is disclosed. A first PMOS transistor P1 and a first NMOS transistor N1 constitute a first CMOS inverter, and a second PMOS transistor P2 and a second NMOS transistor N2 constitute a second CMOS inverter. An output port of the first CMOS inverter and an input port of the second CMOS inverter are connected, and an input port of the first CMOS inverter and an output port of the second CMOS inverter are connected. Therefore, the first and second PMOS transistors P1 and P2 and the first and second NMOS transistors N1 and N2 constitute a flip-flop circuit. A first memory node M1 exists at the output port of the first CMOS inverter concurrently with the input port of the second CMOS inverter. A second memory node M2 exists at the output port of the second CMOS inverter concurrently with the input port of the first CMOS inverter. Data is stored at the first and second memory nodes M1 and M2.

A third NMOS transistor N3 and a fourth NMOS transistor N4 are pass transistors, providing access to the first and second memory nodes M1 and M2, respectively. The gate of the third NMOS transistor N3 is connected to a wordline WL, the source of the third NMOS transistor N3 is connected to the first memory node N1, and the drain of the third NMOS transistor N3 is connected to a bitline BL. The gate of the fourth NMOS transistor N4 is connected to the wordline WL, the source of the fourth NMOS transistor N4 is connected to the second memory node N2, and the drain of the fourth NMOS transistor N4 is connected to a complementary bitline /BL.

A third PMOS transistor P3 is added to a conventional single port semiconductor SRAM device to create a dual port semiconductor SRAM. Data stored at the second memory node M2 can be read by operating the third PMOS transistor P3.

The gate of the third PMOS transistor P3 is connected to a scan address line (SAL), the source of the third PMOS transistor P3 is connected to the second memory node M2, and the drain of the third PMOS transistor P3 is connected to a scan data-out line (SDOL).

The equivalent circuit shown in FIG. 2, allows data writes or reads from the memory nodes M1 and M2 by selecting the wordline WL, the bitline BL, and the complementary bitline /BL, with the selected lines functioning as a first port. In addition, data is read from the memory node M2 by selecting the scan address line SAL and the scan data-out line SDOL, with the selected lines functioning as a second port. Therefore, in a semiconductor memory device including the equivalent circuit shown in FIG. 2, data can be read from the first port independently of data reads using the second port, without detrimental effect on the state of the first and second memory nodes N1 and N2.

Hereinafter, the memory cell layout of a semiconductor memory device including the equivalent circuit shown in FIG. 2 will be described in detail with reference to FIGS. 3 through 7.

Figure 3:
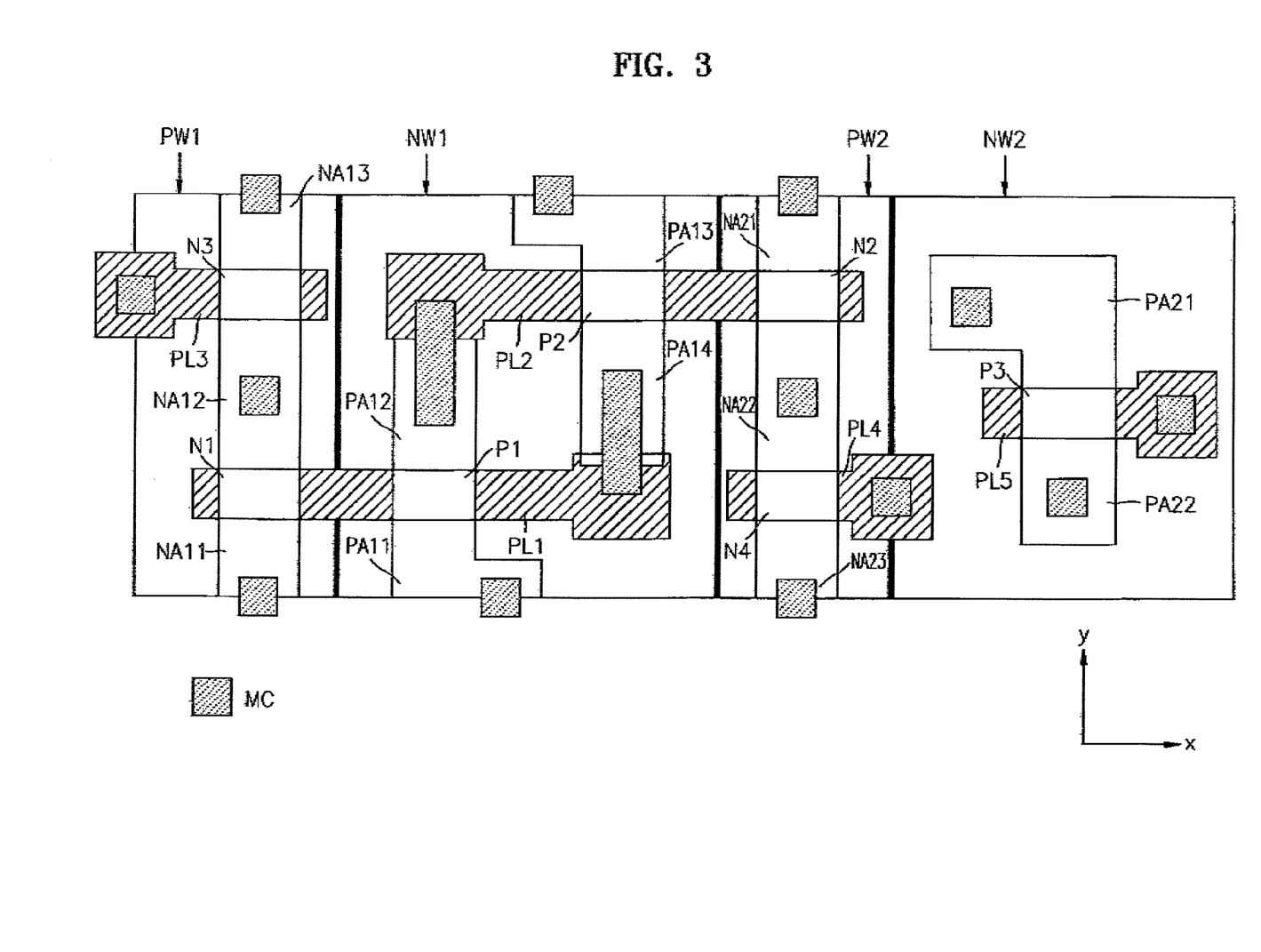
FIG. 3 is a layout diagram of a memory cell constituting a first layer of the dual port semiconductor memory device of FIG. 2.

FIG. 3 is a layout diagram of a memory cell constituting a first layer of the dual port semiconductor memory device of FIG. 2. Referring to FIG. 3, a semiconductor substrate, two p-wells PW1 and PW2 and two n-wells NW1 and NW2 formed on the semiconductor substrate, n+ diffusion areas NA formed on the p-wells PW1 and PW2, p+ diffusion areas PA formed on the n-wells NW1 and NW2, wiring layers PL1 through PL5 formed on the semiconductor substrate, and a plurality of metal contacts MC are formed on a first layer of a memory cell. The wiring layers PL1 through PL5 are formed of a conductive material, such as polysilicon or silicide.

More specifically, the two p-wells PW1 and PW2 and the n-wells NW1 and NW2 are formed on the semiconductor substrate. A first NMOS transistor N1 and a third NMOS transistor N3 are formed on the first p-well PW1, and a second NMOS transistor N2 and a fourth NMOS transistor N4 are formed on the second p-well PW2. A first PMOS transistor P1 and a second PMOS transistor P2 are formed on the first n-well NW1, and a third PMOS transistor P3 is formed on the second n-well NW2.

One embodiment provides the p-wells PW1 and PW2 and the n-wells NW1 and NW2 arranged in an alternating and adjacent manner. Therefore, the memory cell including the p-wells PW1 and PW2 and the n-wells NW1 and NW2 is rectangular and longer in the X dimension as shown in FIG. 3. A semiconductor memory device, including a rectangular memory cell whose main axis is much longer than the minor axis, is suitable for a semiconductor integrated chip having a main axis much longer than a minor axis, such as a liquid crystal display (LCD) driver integrated circuit or other circuit of similar geometry.

In one embodiment with alternating p-wells and n-wells, the first n-well NW1 and the second n-well NW2 sandwich the second p-well PW2, and the first p-well PW1 and the second p-well PW2 sandwich the first n-well NW1. Therefore, the first p-well PW1, the first n-well NW1, the second p-well PW2, and the second n-well NW2 are sequentially arranged on a single memory cell. Likewise they could be arranged in the reverse order. Memory cells may be arranged so that two horizontally or vertically adjacent memory cells are in symmetry. The axis of symmetry could be a boundary between two horizontally adjacent memory cells or a boundary between two vertically adjacent memory cells. In one embodiment metal contacts MC and via contacts (VC) in adjacent memory cells have symmetry with respect to the memory cell boundary.

Figure 4:
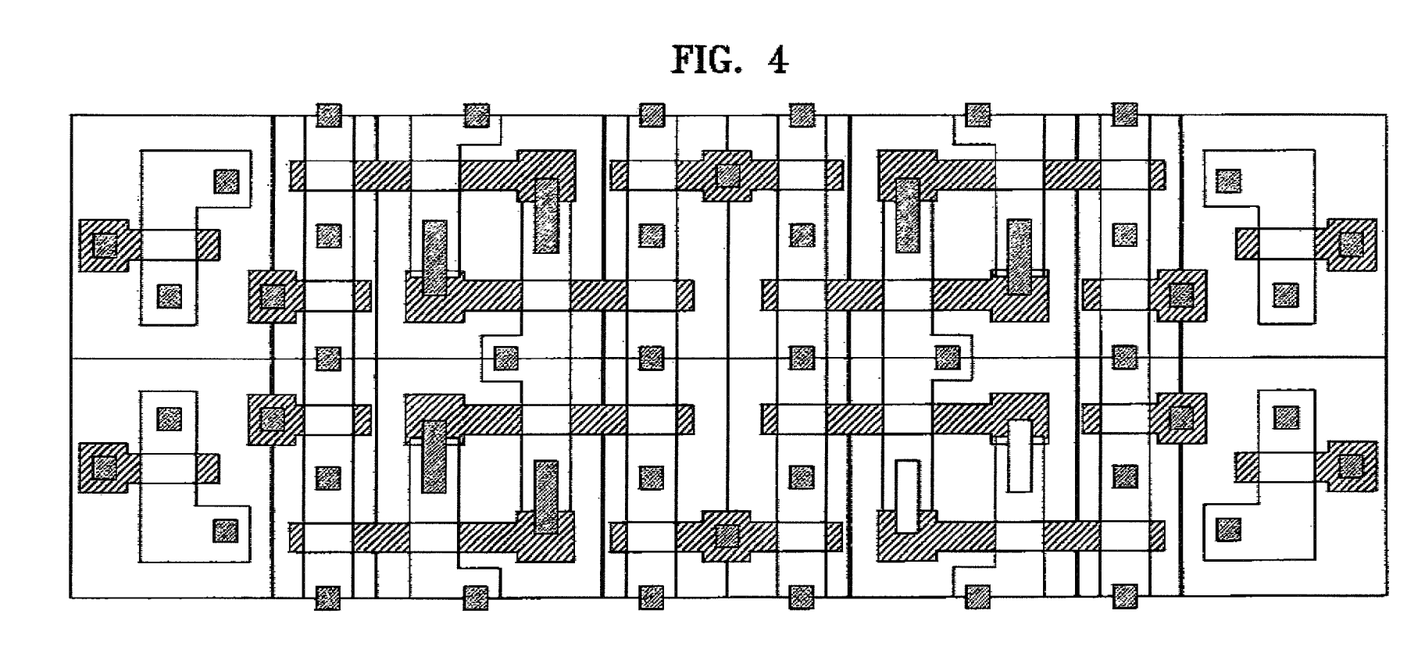
FIG. 4 is a layout diagram of four memory cells, including the memory cell shown in FIG. 3.

FIG. 3 illustrates a memory cell, on which the first p-well PW1, the first n-well NW1, the second p-well PW2, and the second n-well NW2 are sequentially arranged, and FIG. 4 illustrates the arrangement of four memory cells, including the memory cell shown in FIG. 3.

Referring to FIG. 3, the first wiring layer PL1 and the second wiring layer PL2 are formed on the semiconductor substrate. The first wiring layer PL1 spreads over the first n-well NW1 and the first p-well PW1, and the second wiring layer PL2 spreads over the first n-well NW1 and the second p-well PW2. The first and second wiring layers PL1 and PL2 are formed in parallel with a predetermined distance therebetween. Furthermore, the first and second wiring layers PL1 and PL2 are perpendicular to the boundary between the first n-well NW1 and the first or second p-well PW1 or PW2.

In the present embodiment, one end of the first wiring layer PL1, placed in the first n-well NW1, serves as a gate electrode for the first PMOS transistor P1, and the other end of the first wiring layer PL1, placed in the first p-well PW1, serves as a gate electrode for the first NMOS transistor N1.

One end of the second wiring layer PL2, placed in the first n-well NW1, serves as a gate electrode for the second PMOS transistor P2, and the other end of the second wiring layer PL2, placed in the second p-well PW2, serves as a gate electrode for the second NMOS transistor N2.

FIG. 3 displays the third wiring layer PL3 formed in the first p-well PW1. The third wiring layer PL3 serves as a gate electrode for the third NMOS transistor N3 and can be formed running in parallel with the second wiring layer PL2. The third wiring layer PL3 may be formed so that the end of the third wiring layer, connected to a first wordline, can extend over a boundary between the corresponding memory cell and an adjacent memory cell and can share a metal contact MC with the adjacent memory cell.

The fourth wiring layer PL4 may be formed in the second p-well PW2. The fourth wiring layer PL4 serves as a gate electrode for the fourth NMOS transistor N4 and is formed parallel with the first wiring layer PL1. It is possible to curb the area of each unit memory cell by placing the end of the fourth wiring layer PL4, connected to the first wordline, at the boundary between the second p-well PW2 and the second n-well NW2.

As shown in the embodiment in FIG. 3, the fifth wiring layer PL5 is formed in the second n-well NW2. The fifth wiring layer PL5 serves as a gate electrode for the third PMOS transistor P3. A metal contact MC is placed at one end of the fifth wiring layer PL5 so that the corresponding end of the fifth wiring layer PL5 can be electrically connected to a scan address line (SAL).

The layout of N+ and P+ active regions of the memory cell illustrated in FIG. 3 will be described in the following paragraphs.

Referring to FIG. 3, P+ active regions PA11 and PA12 are formed by implanting P-type impurities into both sides of the first wiring layer PL1 in the first n-well NW1. As a result of the impurity implantation, the first PMOS transistor P1, is formed using the first wiring layer PL1 as a gate electrode. A metal contact MC is placed at a source PA11 of the first PMOS transistor P1 so that the source PA11 can be electrically connected to a power supply line Vdd. Another metal contact MC is placed at a drain PA12 of the first PMOS transistor P1 so that the drain PA12 can be electrically connected to an upper wiring layer, i.e., a first memory node N1.

N+ active regions NA11 and NA12 are formed by implanting N-type impurities into both sides of the first wiring layer PL1 in the first p-well PW1. As a result of the impurity implantation, the first NMOS transistor N1, is formed using the first wiring layer PL1 as a gate electrode. A metal contact MC is placed at a source NA11 of the first NMOS transistor N1 so that the source NA11 can be electrically connected to a ground line Vss. Another metal contact MC is placed at a drain NA12 of the first NMOS transistor N1 so that the drain NA12 can be electrically connected to the upper wiring layer, i.e., the first memory node N1.

In FIG. 2, the first NMOS transistor N1 is connected to the third NMOS transistor N3 in series. In other words, the drain of the first NMOS transistor N1 is electrically connected to the source of the third NMOS transistor N3. Therefore, as shown in FIG. 3, the N+ active region NA12 where the drain of the first NMOS transistor N1 is formed can be connected to an N+ active region where the source of the third NMOS transistor N3 is formed. The drain of the first NMOS transistor N1 and the source of the third NMOS transistor N3 can be electrically connected by forming the N+ active region NA12 and another N+ active region NA13. The N+ active regions NA12 and NA13 are formed by implanting N-type impurities into both sides of the third wiring layer PL3 in the first p-well PW1. Therefore, the metal contact MC placed in the N+ active region NA12 is shared by the drain of the first NMOS transistor N1 and the source of the third NMOS transistor N3.

In the N+ active region NA13, across the third wiring layer PL3 from the N+ active region NA12, the drain of the third NMOS transistor N3 is located. A metal contact MC is placed at the drain of the third NMOS transistor N3 so that the drain of the third NMOS transistor N3 can be connected to a bitline BL.

P+ active regions PA13 and PA14 are formed by implanting P-type impurities into both sides of the second wiring layer PL2 in the first n-well NW1. As a result of the impurity implantation, the second PMOS transistor P2, is formed using the second wiring layer PL2 as a gate electrode. A metal contact MC is located at a source PA13 of the second PMOS transistor P2 so that the source PA13 can be connected to the power source line Vdd. Another metal contact MC is located at a drain PA14 of the second PMOS transistor P2 so that the drain PA14 can be connected to an upper wiring layer, i.e., a second memory node N2.

N+ active regions NA21 and NA22 are formed by implanting N-type impurities into both sides of the second wiring layer PL2 in the second p-well PW2. As a result of the impurity implantation, the second NMOS transistor N2, is formed using the second wiring layer PL2 as a gate electrode. A metal contact MC is placed at a source NA21 of the second NMOS transistor N2 so that the source NA21 can be connected to the ground line Vss. Another metal contact MC is placed at a drain NA22 of the second NMOS transistor N2 so that the drain NA22 can be connected to the first memory node N2.

As shown in FIG. 2, the second NMOS transistor N2 is connected to the fourth NMOS transistor N4 in series. In other words, the drain of the second NMOS transistor N2 and the source of the fourth NMOS transistor N4 are electrically connected. Therefore, as shown in FIG. 3, the N+ active region NA22 where the drain of the second NMOS transistor N2 is formed can be connected to an N+ active region where the source of the fourth NMOS transistor N4 is formed.

Preferably, the drain of the second NMOS transistor N2 and the source of the fourth NMOS transistor N4 are electrically connected by forming the N+ active region NA22 and another N+ active region NA23. The N+ active regions NA22 and NA23 are formed by implanting N-type impurities into both sides of the fourth wiring layer PL4 in the second p-well PW2. The metal contact MC, located in the N+ active region NA22, is shared by the drain of the second NMOS transistor N2 and the source of the fourth NMOS transistor N4.

In the N+ active region NA23, across the fourth wiring layer PL4 from the N+ active region NA22, the drain of the fourth NMOS transistor N4 is located. A metal contact MC is located at the drain of the fourth NMOS transistor N4 so that the drain of the fourth NMOS transistor N4 is connected to a complimentary bitline /BL.

Referring to FIG. 3, P+ active regions PA21 and PA22 are formed by implanting P-type impurities into both sides of the fifth wiring layer PL5 in the second n-well NW2. As a result of the impurity implantation, the third PMOS transistor, which uses the fifth wiring layer PL5 as a gate electrode, is formed. A metal contact MC is placed at a source PA21 of the third PMOS transistor P3 so that the source PA21 can be connected to the second memory node M2. Another metal contact MC is placed at a drain PA22 of the third PMOS transistor P3 so that the drain PA22 can be connected to an upper wiring layer, i.e., a scan data out line SDOL.

The layout of metal contacts MC of the memory cell illustrated in FIG. 3 will be described in the following paragraphs. Metal contacts MC electrically connect conductive materials formed on the first layer of the memory cell and conductive materials formed on the second layer of the memory cell. In other words, metal contacts MC are arranged at predetermined locations so as to connect sources and drains of transistors, constituting each memory cell, polysilicon wiring layers, and upper conductive lines.

Metal contacts MC help effectively arrange elements of a memory cell and reduce the overall number of elements of adjacent memory cells. For example, a single metal contact can be arranged at a boundary between adjacent memory cells or a connection place in a memory cell. In particular, the two metal contacts MC, placed in the first n-well NW1, electrically connect the first or second wiring layer PL1 or PL2 and the drain of the first or second PMOS transistor P1 or P2 to an upper conductive layer so that the first or second wiring layer PL1 or PL2 can be electrically connected to the first or second PMOS transistor P1 or P2.

Figure 5:
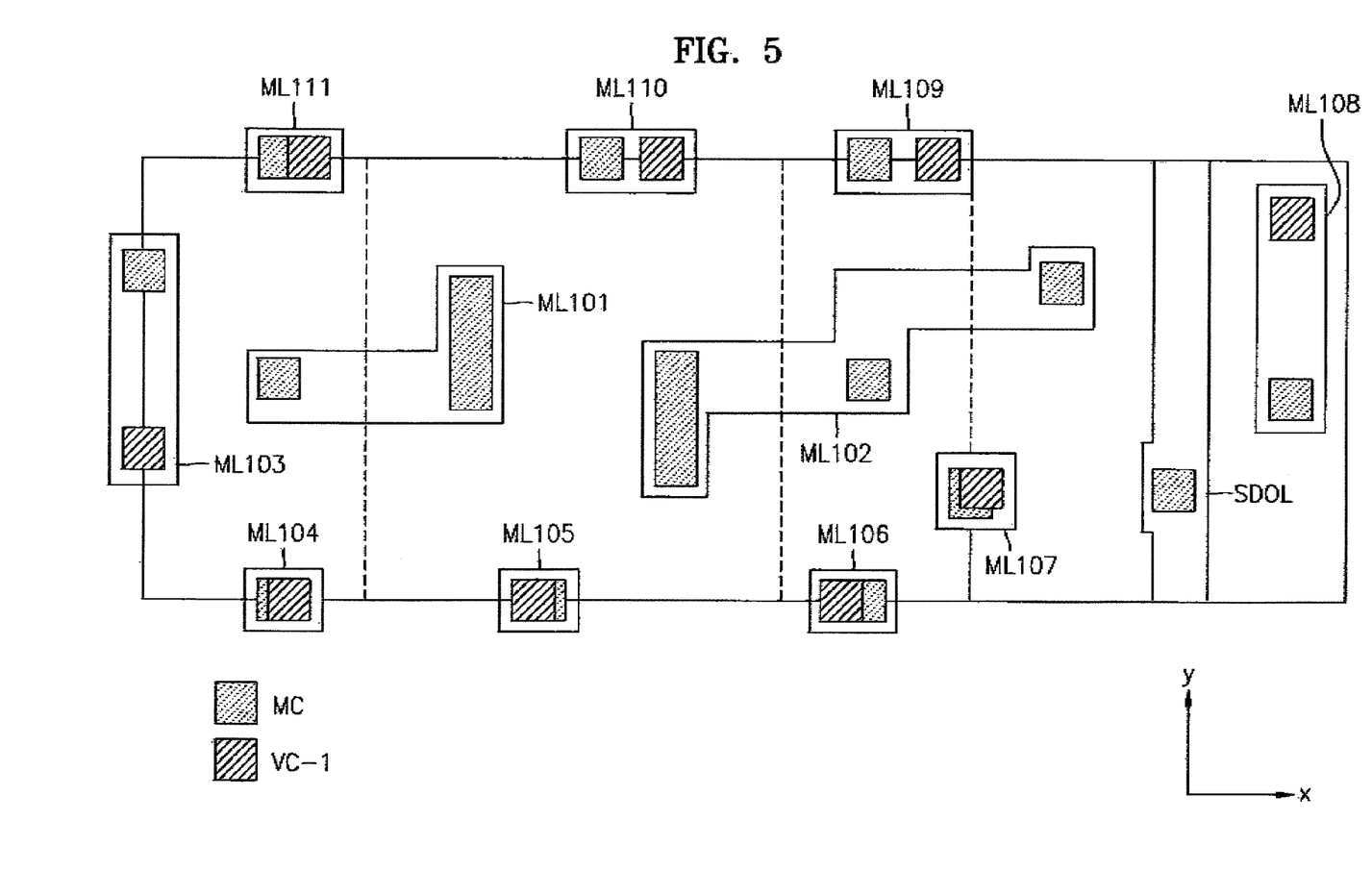
FIG. 5 is a layout diagram of a memory cell constituting a second layer of the dual port semiconductor memory device shown in FIG. 2.

The layout of a memory cell, which is placed over the memory cell illustrated in FIG. 3, will be described more fully with reference to FIG. 5. FIG. 5 is a layout diagram of a memory cell constituting a second layer of the dual port semiconductor memory device shown in FIG. 2. In FIG. 5, dotted lines indicate boundaries among n-wells and p-wells, i.e., isolation areas.

Referring to FIG. 5, a first metal wiring layer ML101 is formed on a first p-well PW1 and a first n-well NW1. The first metal wiring layer ML101 electrically connects conductive materials electrically connected to the first memory node M1, i.e., the metal contact MC that connects the drain PA12 of the first PMOS transistor P1 and the second wiring layer PL2 and the metal contact MC that connects the drain of the first NMOS transistor N1 and the source NA12 of the third NMOS transistor N3.

A first metal wiring layer ML102 is formed over the first layer shown in FIG. 3, extending over the first n-well NW1, the second p-well PW2, and the second n-well NW2. The second metal wiring layer ML 102 electrically connects conductive materials electrically connected to the second memory node M2, i.e., the metal contact MC that connects the drain PA14 of the second PMOS transistor P2 and the first wiring layer PL1 and the metal contact MC that connects the drain of the second NMOS transistor N2 and the source NA22 of the fourth NMOS transistor N4.

On the second layer, as shown in FIG. 5, a scan data-out line SDOL is formed. The scan data-out line SDOL is preferably formed extending in parallel with boundaries between adjacent wells, i.e., along the direction of the Y-axis in order to be in parallel with a pair of bitlines BL and /BL. The reason that the pair of bitlines BL and /BL is preferably formed extending in parallel with boundaries between adjacent wells will be described in greater detail later in this disclosure.

As described above, the scan data-out line SDOL corresponds to a second port data line, allowing data stored at the second memory node M2 to be read using the third PMOS transistor P3, and thus the scan data-out line SDOL is electrically connected to the metal contact MC that is connected to the drain PA22 of the third PMOS transistor P3. Therefore, the scan data-out line SDOL is placed on the second n-well NW2. The scan data-out line SDOL extends beyond the corresponding memory cell along the direction of the Y-axis.

First metal wiring layers ML103 through ML111 electrically connect corresponding metal contacts MC and first via contacts (VC-1). The size of the first metal wiring layers ML103 through ML111 are dependent on the locations of the metal contacts MC and the first via contacts VC-1 that they are supposed to connect.

The first via contacts VC-1 electrically connect the conductive materials on the second layer and conductive materials on a third layer. In other words, the conductive materials, formed on the third layer, are connected to the conductive materials above the second layer, i.e., the pair of bitlines BL and /BL, the power supply line Vdd, the ground line Vss, the word line WL, and the scan address line SAL.

Figure 6:
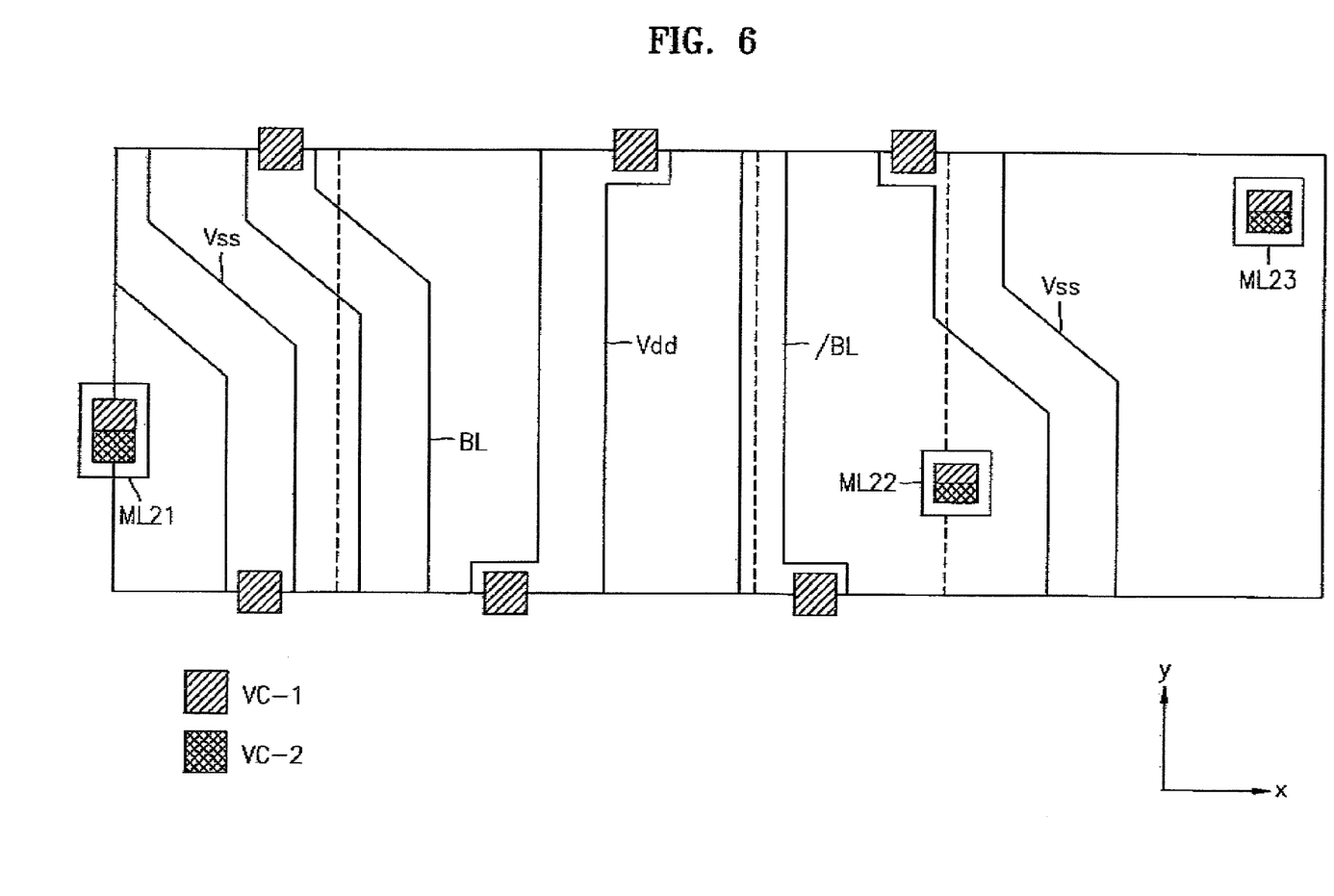
FIG. 6 is a layout diagram of a memory cell constituting a third layer of the dual port semiconductor memory device shown in FIG. 2.

The layout of a memory cell, which is placed over the memory cell shown in FIG. 5 will be described more fully with reference to FIG. 6. FIG. 6 is a layout diagram of a memory cell constituting a third layer of the dual port semiconductor memory device shown in FIG. 2. In FIG. 6, dotted lines indicate boundaries among n-wells and p-wells, i.e., isolation areas.

Referring to FIG. 6, the bitline BL and the complementary bitline /BL run in parallel. The bitline BL is electrically connected to the drain NA13 of the second NMOS transistor N2, which is formed in the first p-well, by the corresponding first via contact VC-1 and metal contact MC. The complementary bitline /BL is electrically connected to the drain NA23 of the fourth NMOS transistor N4, which is formed in the second p-well PW2, by the corresponding first via contact VC-1 and metal contact MC.

Even though the bitline BL is illustrated in FIG. 6 with some curves, it can be straightened by arranging the elements of the dual port semiconductor memory device of the present invention in a different manner from the one set forth herein. For example, the bitline BL may be made to run straight on the third layer by placing first via contacts VC-1 on the first n-well NW1 and electrically connecting the first via contacts VC-1 to metal contacts MC, placed on the first p-well PW1 via the first metal wiring layer ML111.

In one embodiment, the bitline BL and the complimentary bitline /BL are arranged in parallel with well boundaries. In the present embodiment, as described above, a total of four wells are arranged side by side in a memory well, and thus the memory cell extends longer along the direction of the X-axis than it does along the direction of the Y-axis. The minor axis of the memory cell is in parallel with inter-well boundaries in the memory cell. The length of the pair of bitlines BL and /BL can be shortened by arranging the pair of bitlines BL and /BL along the direction of the minor axis of the memory cell. As the pair of bitlines BL and /BL become shorter, parasitic capacitance becomes smaller, which helps boost the operation speed of a semiconductor memory device.

Referring to FIG. 6, a single power supply line Vdd and two ground lines Vss as well as the pair of bitlines BL and /BL are arranged on the third layer. The power supply line Vdd is electrically connected to the source PA11 of the first PMOS transistor P1 and the source PA13 of the second PMOS transistor P2 by the corresponding first via contact VC-1 and metal contact MC. The two ground lines Vss are electrically connected to the source NA11 of the first NMOS transistor N1 and the source NA21 of the second NMOS transistor N2 via corresponding first via-contacts VC-1 and metal contacts MC.

In FIG. 6 the power supply line Vdd and the ground lines Vss are arranged in parallel with well boundaries. It is advantageous to arrange the power supply line Vdd, the two ground lines Vss, and the pair of bitlines BL and /BL in an alternating manner. For example, as shown in FIG. 6, the power supply line Vdd is between the bitline BL and the complimentary bitline /BL, and the ground lines Vss are respectively arranged at both sides of the pair of bitline BL and complimentary bitline /BL. Therefore, it is possible to prevent crosstalk between adjacent pairs of bitlines from different memory cells.

As shown in FIG. 6, second metal wiring layers ML21, ML22, and ML23 are formed to electrically connect first via contacts VC-1 and second via contacts VC-2.

Figure 7:
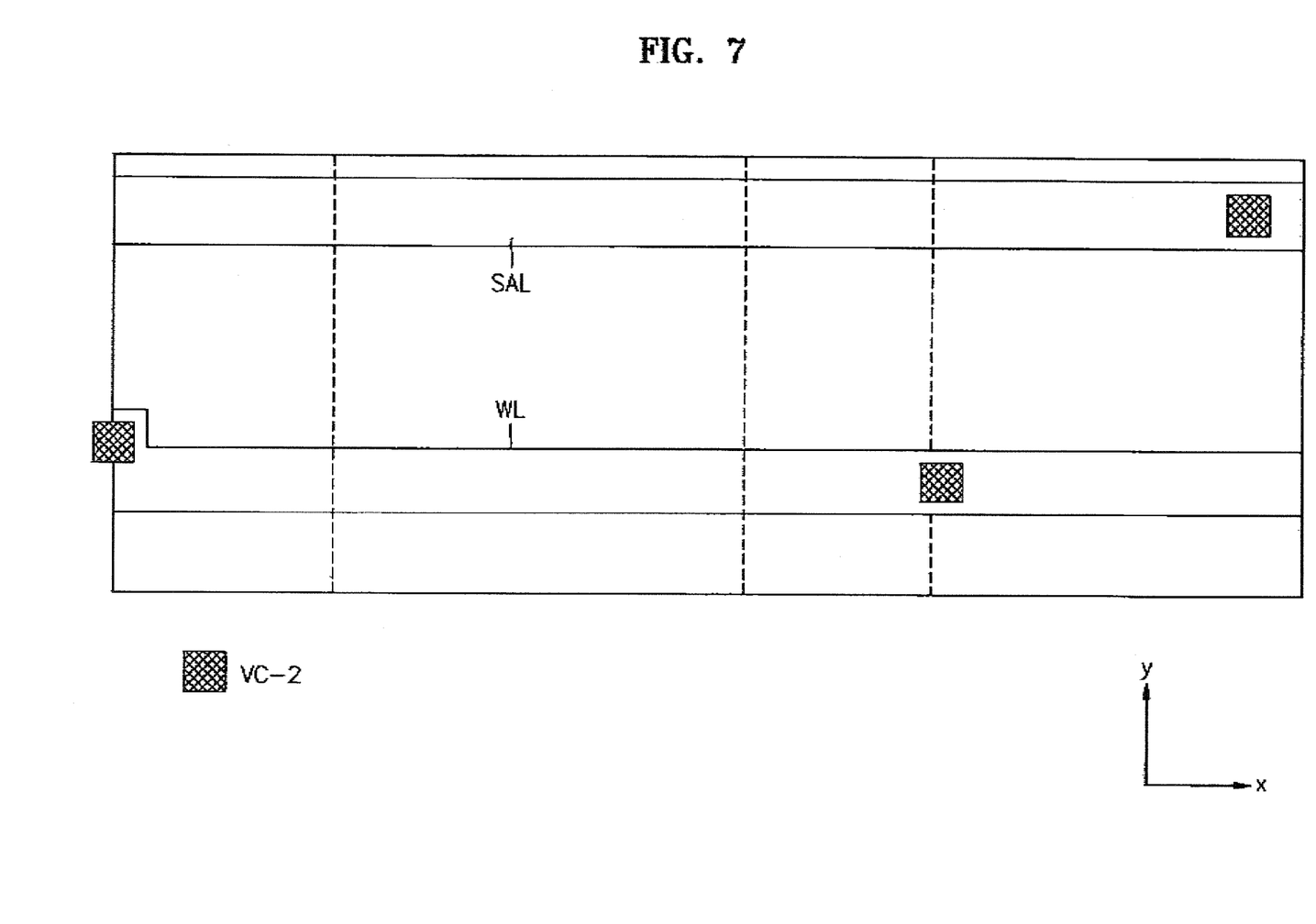
FIG. 7 is a layout diagram illustrating a memory cell constituting a fourth layer of the dual port semiconductor memory device shown in FIG. 2.

The layout of a memory cell, which is placed over the memory cell illustrated in FIG. 6, will be described more fully with reference to FIG. 7. FIG. 7 is a layout diagram of a memory cell constituting of a fourth layer of the dual port semiconductor memory device shown in FIG. 2. In FIG. 7, dotted lines indicate boundaries among n-wells and p-wells, i.e., isolation areas.

Referring to FIG. 7, a wordline WL, a scan address line SAL, and second via contacts VC-2 are formed on the fourth layer.

More specifically, the wordline WL and the scan address line SAL are arranged in parallel with each other. The wordline WL is electrically connected to the third wiring layer PL3, which serves as a gate electrode for the third NMOS transistor N3, by the corresponding second via contact VC-2, first via contact VC-1, and metal contact MC. In addition, the wordline is also electrically connected to the fourth wiring layer PL4, which serves as a gate electrode for the fourth NMOS transistor N4, via corresponding second via contact VC-2, first via contact VC-1, and metal contact MC. The scan address line SAL is electrically connected to the fifth wiring layer PL5, which serves as a gate electrode for the third PMOS transistor P3, via corresponding second via contact VC-2, first via contact VC-1, and metal contact MC.

When the pair of bitlines BL and /BL run in parallel with well boundaries, the wordline WL and the scan address line SAL are arranged in perpendicular to the well boundaries, i.e., along the direction of the X-axis.

Figure 8:
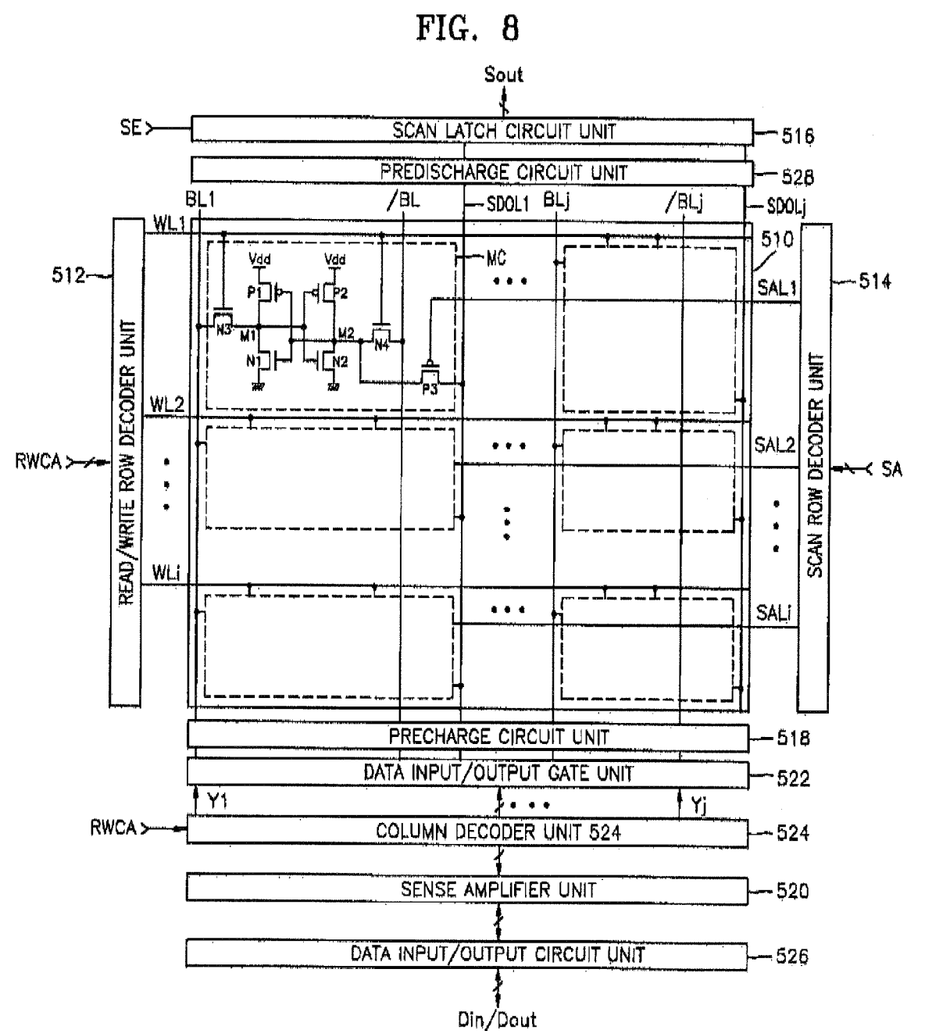
FIG. 8 is a block diagram of a semiconductor memory device including a memory cell array unit, comprised of memory cells, according to a preferred embodiment of the present invention.

Hereinafter, a dual port semiconductor memory device having the above-mentioned memory cell layouts and including peripheral circuit devices will be described in greater detail. FIG. 8 is a block diagram of a semiconductor memory device, including a memory cell array unit having a memory cell arrangement according to one embodiment of the present invention.

Referring to FIG. 8, a dual port semiconductor memory device includes a memory cell array unit 510, a read/write row decoder unit 512, a scan row decoder unit 514, a column decoder unit 524, a scan latch circuit unit 516, a precharge circuit unit 518, a predischarge circuit unit 528, a data input/output gate unit 522, a sense amplifier unit 520, and a data input/output circuit unit 526.

In the memory cell array unit 510, a plurality of memory cells are arranged in a matrix. In each memory cell, as disclosed above, first and second n-wells and first and second p-wells are arranged in an alternating manner. In the first n-well, first and second PMOS transistors are located. In the second n-well, a third PMOS transistor is located. In the first p-well, first and third NMOS transistors are located. In the second p-well, second and fourth PMOS transistors are located. Wiring layers, bitline pairs, scan data-out lines, wordlines, and scan address lines are arranged on a semiconductor substrate in a manner that has been described above.

The functions of each element of the dual port semiconductor memory device shown in FIG. 8 will become more apparent in the following paragraphs.

For a read/write operation, the read/write row decoder unit 512 decodes a read/write row address RWRA and selects one from among a plurality of wordlines WL1 through WLi. The scan row decoder unit 514 decodes a scan address SA and selects one from among a plurality of scan address lines SAL1 through SALi. The column decoder unit 524 decodes a read/write column address and generates column selection signals Y1 through Yj, which will be used to select one pair of bitlines from among a plurality of pairs of bitlines (BL1, /BL1) through (BLj, /BLj). The scan latch circuit unit 516 latches data output via scan data-out lines SDOL1 through SDOLj in response to a scan enable signal SE and then generates scan output signals Sout. The precharge circuit unit 518 precharges the pairs of bitlines (BL1, /BL1) through (BLj, /BLj), and the predischarge circuit unit 528 predischarges the scan data-out lines SDOL1 through SDOLj. The data input/output gate unit 522 inputs or outputs data via the pairs of bitlines (BL1, /BL1) through (BLj, /BLj) in response to the column selection signals Y1 through Yj. The sense amplifier unit 520 amplifies a voltage difference between each of the pairs of bitlines (BL1, /BL1) through (BLj, /BLj). The data input/output circuit unit 526 generates output data Dout using data output from the sense amplifier unit 520, and receives input data Din and outputs the input data Din to the data input/output gate unit 522.

The dual port semiconductor memory device further includes a plurality of wiring lines, having a fixed voltage potential. The wiring layers may be arranged on the same layer as the pairs of bitlines (BL1, /BL1) through (BLj, /BLj) are, in which case the wiring layers and the pairs of bitlines (BL1, /BL1) through (BLj, /BLj) are preferably arranged in an alternating manner. A wiring layer arranged between a pair of bitlines could be a power supply line.

The dual port semiconductor memory device includes rectangular memory cells whose major axis is much longer than the minor axis. Therefore, the dual port semiconductor memory device is suitable for an LCD driver integrated circuit (LDI) having a very short minor axis, as well as any other integrated circuit of similar geometry.

According to one embodiment, each memory cell includes two p-wells, two n-wells, and PMOS scan transistors, seven transistors in total, allowing a semiconductor memory device comprised of such memory cells on a semiconductor substrate. The semiconductor memory device disclosed herein can enhance noise margins, in comparison with conventional NMOS scan transistors.

In addition, according to one embodiment, in a memory cell, two p-wells and two n-wells may be arranged in a row, and a pair of bitlines and a scan data-out line may be arranged in perpendicular to boundaries among the p-wells and the n-wells. As disclosed above it is advantageous for the pair of bitlines and the scan data-out line run along the direction of a minor axis of the memory cell. Therefore, a pair of bitlines is shorter in this arrangement manner than in others, reducing parasitic capacitance, enhancing the operation speed of a semiconductor memory device.

Moreover, according to one embodiment, conductive lines, having a fixed electric potential, may be arranged between a pair of bitlines or at both sides of the pair of bitlines. This arrangement limits crosstalk between each pair of bitlines or between adjacent pairs of bitlines from different memory cells.

Furthermore, according to one embodiment, n-wells where PMOS scan transistors are placed are formed at one side of a memory cell. Accordingly, the major axis of the memory cell is much longer than the minor axis. Therefore, the memory cell is suitable for a semiconductor device, such as an LCD driver IC, and others with similar geometry, which are required to have a major axis longer than a minor axis.

We claim:

1. A dual port semiconductor memory cell, comprising:
   a first CMOS inverter including a first NMOS transistor, a first PMOS transistor, an input port, and an output port;
   a second CMOS inverter including a second NMOS transistor, a second PMOS transistor, an input port coupled to the output port of the first CMOS inverter and constitutes a first memory node together with the output port of the first CMOS inverter, and an output port coupled to the input port of the first CMOS inverter and constitutes a second memory node together with the input port of the first CMOS inverter;
   a third NMOS transistor having a gate coupled to a wordline, a drain coupled to a bitline, and a source coupled to the first memory node;
   a fourth NMOS transistor having a gate coupled to the wordline, a drain coupled to a complementary bitline, and a source coupled to the second memory node; and
   a third PMOS transistor having a gate coupled to a scan address line, a source coupled to the second memory node, and a drain coupled to a scan data-out line;
   where the memory cell is divided into first and second n-wells where P+ active regions are formed and first and second p-wells where N+ active regions are formed.

2. The dual port semiconductor memory cell of claim 1 where the first p-well, the second p-well, the first n-well, and the second n-well are arranged on the semiconductor substrate in an alternating manner.

3. The dual port semiconductor memory cell of claim 2 where the bitline and the complementary bit line and the scan data-out line are arranged in parallel with boundaries among the first and second p-wells and the first and second n-wells.

4. The dual port semiconductor memory cell of claim 2 where the wordline and the scan address line are arranged in perpendicular to the boundaries among the first and second p-wells and the first and second n-wells.

5. The dual port semiconductor memory cell of claim 2 comprising wiring layers, which have fixed voltage potentials and are arranged on the same layer as the bitline and complementary bitline.

6. The dual port semiconductor memory cell of claim 5 where the bitline, the complementary bitline, and the wiring layers are arranged in an alternating manner.

7. The dual port semiconductor memory cell of claim 6 where a wiring layer that is arranged between the bitline and the complementary bitline is a power supply line.

8. A dual port semiconductor memory device with a substrate including a plurality of memory cells, each memory cell comprising:
   a first CMOS inverter including a first NMOS transistor, a first PMOS transistor, an input port, and an output port;
   a second CMOS inverter including a second NMOS transistor, a second PMOS transistor, an input port coupled to the output port of the first CMOS inverter and constitutes a first memory node together with the output port of the first CMOS inverter, and an output port coupled to the input port of the first CMOS inverter and constitutes a second memory node together with the input port of the first CMOS inverter;
   a third NMOS transistor having a gate coupled to a wordline, a drain coupled to a bitline, and a source coupled to the first memory node;
   a fourth NMOS transistor having a gate coupled to the wordline, a drain coupled to a complementary bitline, and a source coupled to the second memory node; and
   a third PMOS transistor having a gate coupled to a scan address line, a source coupled to the second memory node, and a drain coupled to a scan data-out line;
   where the plurality of memory cells are arranged in symmetry with respect to boundaries thereamong; and
   where the memory cell is divided into first and second n-wells where P+ active regions are formed and first and second p-wells where N+ active regions are formed.

9. The dual port semiconductor memory device of claim 8 where the first p-well, the second p-well, the first n-well, and the second n-well are arranged on the semiconductor substrate in an alternating manner.

10. The dual port semiconductor memory device of claim 9 where the bitline and the complementary bit line and the scan data-out line are arranged in parallel with boundaries among the first and second p-wells and the first and second n-wells.

11. The dual port semiconductor memory device of claim 10 where the wordline and the scan address line are arranged in perpendicular to the boundaries among the first and second p-wells and the first and second n-wells.

12. The dual port semiconductor memory device of claim 9 comprising wiring layers, which have fixed voltage potentials and are arranged on the same layer as the bitline and complementary bitline.

13. The dual port semiconductor memory device of claim 12 where the bitline, the complementary bitline, and the wiring layers are arranged in an alternating manner.

14. The dual port semiconductor memory device of claim 13 where a wiring layer that is arranged between the bitline and the complementary bitline is a power supply line.

15. A dual port semiconductor memory device comprising:
   a semiconductor substrate which is divided into first and second n-wells having P+ active regions and first and second p-wells having N+ active regions, the second p-well being located between the first and second n-wells and the first and second p-wells including a plurality of memory cells located at either side of the first n-well;
   a wordline and a scan address line;
   a pair of bitlines, comprised of a bitline and a complementary bitline, and a scan data-out line;
   where each of the plurality of memory cells comprises:
      a first CMOS inverter which includes a first NMOS transistor, a first PMOS transistor, an input port, and an output port;
      a second CMOS inverter which includes a second NMOS transistor, a second PMOS transistor, an input port, coupled to the output port of the first CMOS inverter and constitutes a first memory node together with the output port of the first CMOS inverter, and an output port, coupled to the input port of the first CMOS inverter and constitutes a second memory node together with the input port of the first CMOS inverter;

a third NMOS transistor having a gate coupled to the wordline, a drain coupled to the bitline, and a source coupled to the first memory node;

a fourth NMOS transistor having a gate coupled to the wordline, a drain coupled to the complementary bitline, and a source coupled to the second memory node; and a third PMOS transistor having a gate coupled to the scan address line, a source coupled to the second memory node, and a drain coupled to the scan data-out line, where the first and third NMOS transistors are formed in the N+ active regions of the first p-well, the second and fourth NMOS transistors are formed in the N+ active regions of the second p-well, the first and second PMOS transistors are formed in the P+ regions of the first n-well, and the third PMOS transistor is formed in the P+ active region of the second n-well.

16. The dual port semiconductor memory device of claim 15 where the plurality of memory cells are arranged in symmetry with respect to boundaries thereamong.

17. The dual port semiconductor memory device of claim 15 where the pair of bitlines and the scan data-out line are arranged in parallel with boundaries among the first and second p-wells and the first and second n-wells.

18. The dual port semiconductor memory device of claim 15 where the wordline and the scan address line are arranged in perpendicular to the boundaries among the first and second p-wells and the first and second n-wells.

19. The dual port semiconductor memory device of claim 15 comprising wiring layers, which have fixed voltage potentials and are arranged on the same layer as the pair of bitlines.

20. The dual port semiconductor memory device of claim 19 where the bitline, the complementary bitline, and the wiring layers are arranged in an alternating manner.

21. The dual port semiconductor memory device of claim 20 where a wiring layer arranged between the bitline and the complementary bitline is a power supply line.

* * * * *